United States Patent
Lee

(10) Patent No.: US 8,873,272 B2
(45) Date of Patent: Oct. 28, 2014

(54) SEMICONDUCTOR MEMORY APPARATUS AND TEST CIRCUIT THEREFOR

(75) Inventor: Jae Ung Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 281 days.

(21) Appl. No.: 13/340,956

(22) Filed: Dec. 30, 2011

(65) Prior Publication Data

US 2013/0114326 A1 May 9, 2013

(30) Foreign Application Priority Data

Nov. 4, 2011 (KR) .................. 10-2011-0114430

(51) Int. Cl.
*G11C 11/00* (2006.01)
*G11C 29/12* (2006.01)
*G11C 29/48* (2006.01)

(52) U.S. Cl.
CPC ............ *G11C 29/1201* (2013.01); *G11C 29/48* (2013.01)
USPC ........................................................ 365/148

(58) Field of Classification Search
USPC ........................................................ 365/148
See application file for complete search history.

(56) References Cited

U.S. PATENT DOCUMENTS

| 6,735,727 B1 * | 5/2004 | Lee ................................ 714/711 |
| 2008/0089139 A1 * | 4/2008 | Ong ......................... 365/189.08 |
| 2011/0216583 A1 * | 9/2011 | Hanzawa et al. ............. 365/163 |

FOREIGN PATENT DOCUMENTS

| JP | 2005-077339 A | 3/2005 |
| KR | 20-1995-0000305 Y1 | 1/1995 |
| KR | 1020030071094 A | 9/2003 |
| KR | 100759441 B1 | 9/2007 |
| KR | 1020080096679 A | 10/2008 |

* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

Disclosed is a semiconductor memory apparatus, including: a memory cell array configured to include a plurality of memory cells; a switching unit configured to be coupled to data input and output pads and control a data transfer path of data applied to the data input and output pads in response to a test mode signal; a write driver configured to drive data transferred from the switching unit and write the data in the memory cell array at a normal mode; and a controller configured to transfer the data from the switching unit to the memory cell at a test mode.

18 Claims, 4 Drawing Sheets

SEMICONDUCTOR MEMORY APPARATUS AND TEST CIRCUIT THEREFOR

CROSS-REFERENCES TO RELATED APPLICATION

The present application claims priority under 35 U.S.C. §119(a) to Korean application number 10-2011-0114430, filed on Nov. 4, 2011, in the Korean Intellectual Property Office, which is incorporated herein by reference in its entirety.

BACKGROUND

1. Technical Field

Exemplary embodiments relate generally to a semiconductor integrated circuit, and more particularly to a semiconductor memory apparatus and a test circuit therefor.

2. Related Art

Generally, when data are written in a memory cell of a semiconductor memory apparatus, the data input through input/output pads are written into cells by a write driver. Further, when data are read from memory cells, the data in the memory cells are transferred to a sense amplifier, output amplified data through the input/output pads.

FIG. 1 is a configuration diagram of a general semiconductor memory apparatus.

As shown in FIG. 1, a semiconductor memory apparatus 100 includes a memory cell array 101, an address input buffer 103, a predecoder 105, a column decoder 107, a block decoder 109, a row decoder 111, a data input and output buffer 113, a sense amplifier 115, a write driver 117, and a controller 120.

The memory cell array 101 includes a plurality of memory cells connected between word lines and bit lines.

The address input buffer 103 receives external addresses and converts the received external addresses into internal addresses. The predecoder 105 primarily decodes the internal addresses and then provides the primarily decoded internal addresses to the column decoder 107, the block decoder 109 and the row decoder 111. The column decoder 107 selects word lines to be accessed according to predecoding results. The block decoder 109 selects blocks to be accessed according to the predecoding results. Similarly, the row is decoder 111 selects bit lines to be accessed according to the predecoding results.

The data input and output buffer 113 is coupled to a plurality of data input and output pads (e.g., DQ pads).

When the data writing operation is performed, the data read from the selected memory cells of the memory cell array 101 are amplified in the sense amplifier 115 according to control signals generated from the controller 120 and then output to the DQ pad through the data input and output buffer 113. When the data writing operation is performed, the data input from the DQ pad according to the control signal generated from the controller 120 are provided to the write driver 117 through the input and output buffer 113 and the data are transferred to the memory cells selected from the write driver 117.

The controller 120 includes a first input buffer 121 configured to be driven by a chip select signal /CS, a second input buffer 123 configured to be driven by a write enable signal /WE, a third input buffer 125 configured to be driven by an output enable signal /OE, a write pulse generator 127 configured to generate a write pulse WDEN in response to an output signal of the second input buffer 123, and a read pulse generator 129 configured to generate a read pulse OEN in response to an output signal of the third input buffer 125. The write pulse generator 127 also generates a data input and output buffer enable signal BUFEN and provides the generated data input and output buffer enable signal BUFEN to the data input and output buffer 113. The read pulse generator 129 generates a sense amplifier enable signal SAEN and provides the generated sense amp enable signal SAEN to the sense amplifier 115.

As such, the semiconductor memory apparatus reads the data through the sense amplifier and writes the data through the write driver.

However, when newly developed memory cells are applied to the semiconductor memory apparatus, a verification process of the developed memory cells needs to be performed, but it is difficult to secure reliability of the verification of reading/writing data through the sense amplifier and the write driver. Therefore, when the reading/writing operation is operated through the sense amplifier and the write driver, the cells needs to be evaluated after verifying variables of the reading/writing path, the memory cell array, and the controller, and thus it takes much time to test the cells.

SUMMARY

In one embodiment of the present invention, a semiconductor memory apparatus, includes: a memory cell array configured to include a plurality of memory cells; a switching unit configured to connect to data input and output pads and to control a data transfer path applied to the data input and output pads in response to a test mode signal; a write driver configured to drive data transferred from the switching unit at the time of the normal mode and write the data in the memory cell array; and a controller configured to transfer the data from the switching unit to the memory cell at the time of a test mode.

In another embodiment of the present invention, a semiconductor memory apparatus includes: a memory cell array configured to include a plurality of memory cells connected between bit lines and source lines and driven by potential applied to word lines; and a bidirectional access control unit configured to directly transfer data applied to data input and output pads in the source line direction from the bit line of the memory cell in response to the test mode signal or directly transfer the data applied to the data input and output pads in the bit line direction from the source line of the memory cell.

In still another embodiment of the present invention, a test circuit for a semiconductor memory apparatus includes: a switching unit configured to control a transfer path of data applied to data input and output pads; and a bidirectional access control unit configured to receive data applied to the data input/output pads and directly transfer the data to a memory cell array in response to a test mode signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a test circuit therefor according to the present invention will be described below with reference to the accompanying drawings through exemplary embodiments.

Figure 1:
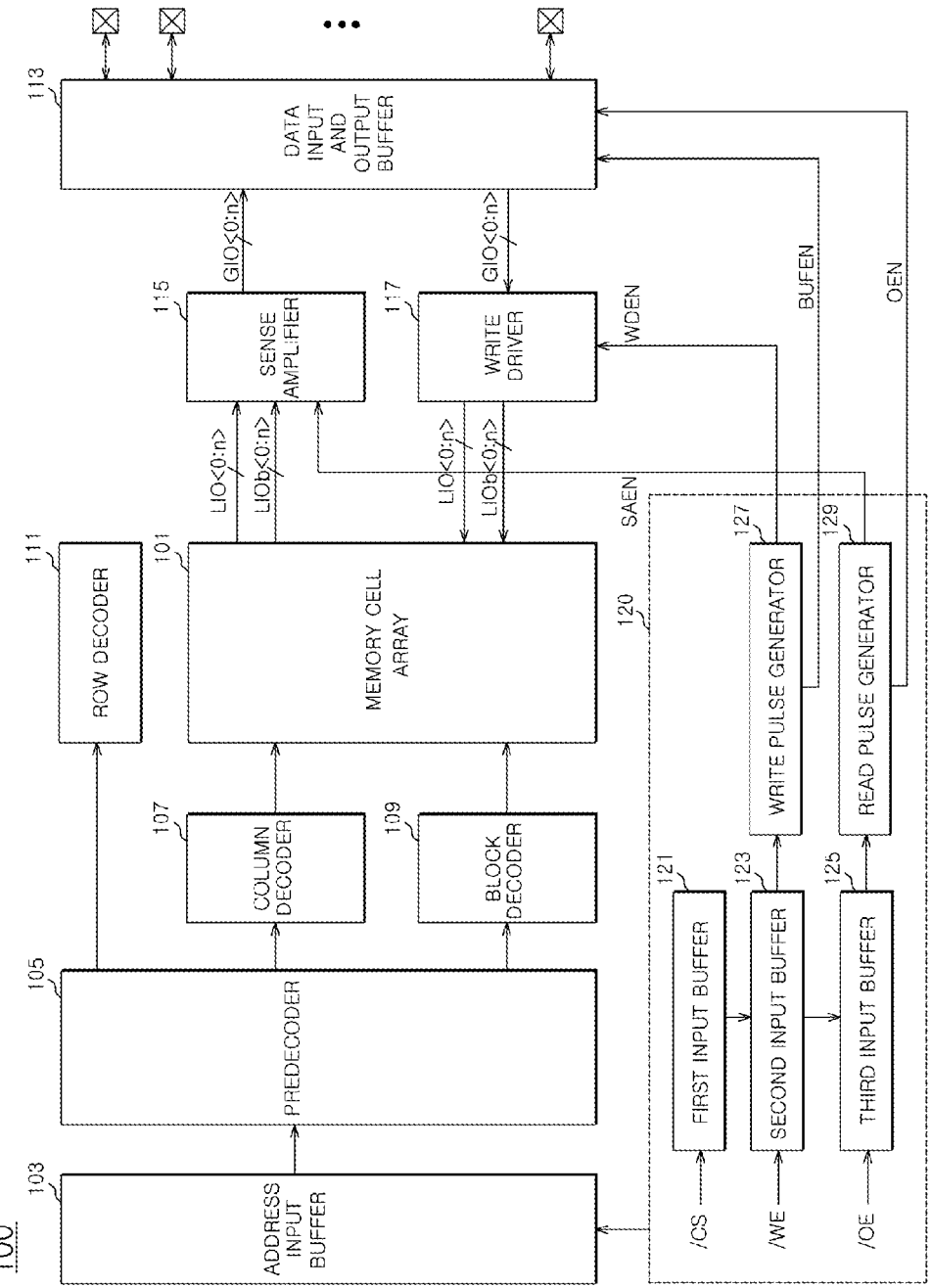
FIG. 1 is a configuration diagram of a semiconductor memory apparatus.
Figure 2:
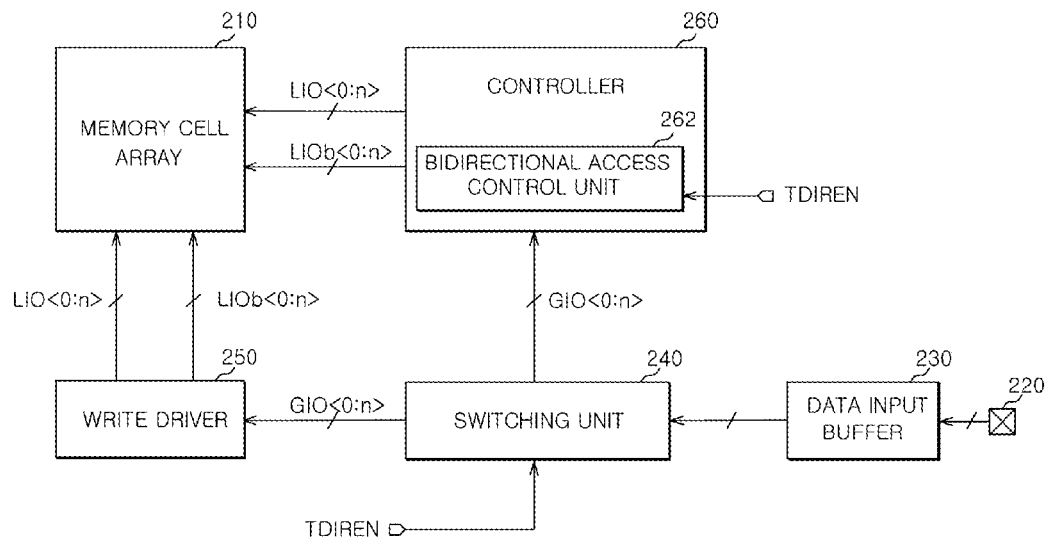
FIG. 2 is a configuration diagram of a semiconductor memory apparatus in accordance with an exemplary embodiment of the present invention.

FIG. 2 is a configuration diagram of a semiconductor memory apparatus in accordance with an exemplary embodiment of the present invention.

FIG. 2 shows main components of a semiconductor memory apparatus for convenience of explanation. However, it is apparent to those skilled in the art that the semiconductor memory apparatus may include other components necessary for operating the semiconductor memory apparatus, for example, an address processing circuit, a control signal generation circuit, or the like.

Referring to FIG. 2, a semiconductor memory apparatus 200 according to an embodiment of the present invention may include a memory cell array 210, data input and output pads 220 (e.g., DQ pads), a data input buffer 230, a switching unit 240, a write driver 250, and a controller 260.

The memory cell array 210 includes a plurality of memory cells connected between word lines and bit lines. Each unit memory cell may be a memory cell that can be read and written by a current driving scheme, e.g., a resistive memory cell having polarity. In an embodiment of the present invention, a unit memory cell may be configured by a magnetic memory cell.

The switching unit 240 establishes a path of data to be provided to the memory cell array 210 through the data input buffer 230 according to an operation mode (e.g., a normal mode and a test mode) of the semiconductor memory apparatus 200. In more detail, the switching unit 240 is driven by a test mode signal TDIREN to transfer data to the write driver 250 through a global input and output line GIO<0:n> at the normal mode and transfer data to a bidirectional access control unit 262 of the controller 260 through the global input and output line GIO<0:n> at the test mode.

The bidirectional access control unit 262 provides test data transferred through the global input and output line GIO<0:n> in response to the test mode signal TDIREN to the memory cell array 210 through a first local input and output line LIO<0:n> or through a second local input and output line LIOb<0:n>.

As described above, when a test is performed, the reliability of the test data written in the memory cell array 210 through the write driver 250 may not be secured. Therefore, according to an embodiment of the present invention, when a test is performed, data are directly written in the memory cell array 210 without passing through the write driver 250. In addition, if the unit memory cell configuring the memory cell array 210 is the resistive memory cell having polarity, current may be supplied in a bit line-source line direction and a source line-bit line direction of the memory cell so that both the data of the logic high level and the data of the logic low level can be directly written.

Therefore, when the semiconductor memory apparatus 200 performs the data writing operation at the normal mode, the switching unit 240 driven by the test mode signal TDIREN transfers the data received from the data input buffer 230 to the write driver 250 through the global input and output lines GIO<0:n>. Further, the write driver 250 transfers the data to the memory cell array 210 through the local input and output lines LIO<0:n> so as to write the data in the memory cells of the memory cell array 210.

On the other hand, when the semiconductor memory apparatus 200 performs the data writing operation at the test mode, the switching unit 240 transfers the data received from the data input buffer 230 to the bidirectional access control unit 262 of the controller 260 through the global input and output lines GIO<0:n>. Further, the bidirectional access control unit 262 provides the test data to the memory cell array 210 through the first or second local input and output lines LIO<0:n> and LIOb<0:n>.

As a result, the test data can be directly written in the memory cell array 210 without passing through the write driver 250 and thus the verification reliability of the test data can be secured. In addition, as the test data are directly written, a test data can be verified without reflecting variables of the write path, the cell array, and the controller are verified. Therefore, the time required for the test may decrease.

The switching unit 240 and the bidirectional access control unit 262 according to an embodiment of the present invention correspond to the test circuit for the semiconductor memory apparatus.

Figure 3:
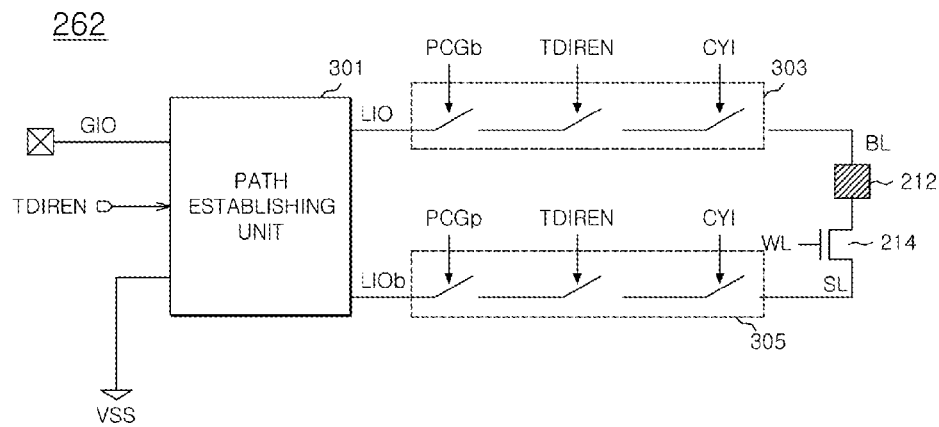
FIG. 3 is an exemplified diagram of a bidirectional access control unit shown in FIG. 2.

FIG. 3 is an exemplified diagram of a bidirectional access control unit shown in FIG. 2.

Referring to FIG. 3, the bidirectional access control unit 262 according to an embodiment of the present invention may include a path establishing unit 301, a first switch 303, and a second switch 305.

One input terminal of the path establishing unit 301 is coupled to the DQ pads through the global input and output lines GIO and the other terminal thereof is coupled to a ground terminal VSS. Further, the test data applied from the DQ pads in response to the test mode signal TDIREN are transmitted to the first local input and output lines LIO or the second local input and output lines LIOb.

The first switch 303 is coupled between the path establishing unit 301 and the bit line BL of the memory cell 212 through the first local input and output lines LIO.

The second switch 305 is coupled between the source line SL of the memory cell 212 and the path establishing unit 301 through the second local input and output lines LIOb.

The first and second switches 303 and 305 may be configured to be turned-off at the normal mode and turned-on at the test mode. In an embodiment of the present invention, each of the first and second switches 303 and 305 maybe configured by serially connecting the plurality of switching devices driven by a precharge signal PCGb, a test mode signal TDIREN and a column select signal CYI, but are not limited thereto. Further, non-explained reference numeral 214 denotes a word line select switch that is turned-on/off by the word line driving signal.

At the test mode, when the data of the first level are written in the memory cell 212, the path establishing unit 301 may transfer, for example, the data of the DQ pads to the memory cell 212 through the first local input and output lines LIO. In addition, when the data of the second level are written, the path establishing unit 301 may transfer the data of the DQ pad to the memory cell 212 through the second local input and output lines LIOb.

Therefore, the data may be directly written in the memory cell 212 without passing through the write driver and the writing current may be provided in the bit line-source line direction and the source line-trine direction of the memory cell 212. Therefore, the test may be performed at high speed and the test data may be written under various conditions.

The operation of the path establishing unit 301 will be described with reference to FIGS. 4 and 5.

Figure 4:
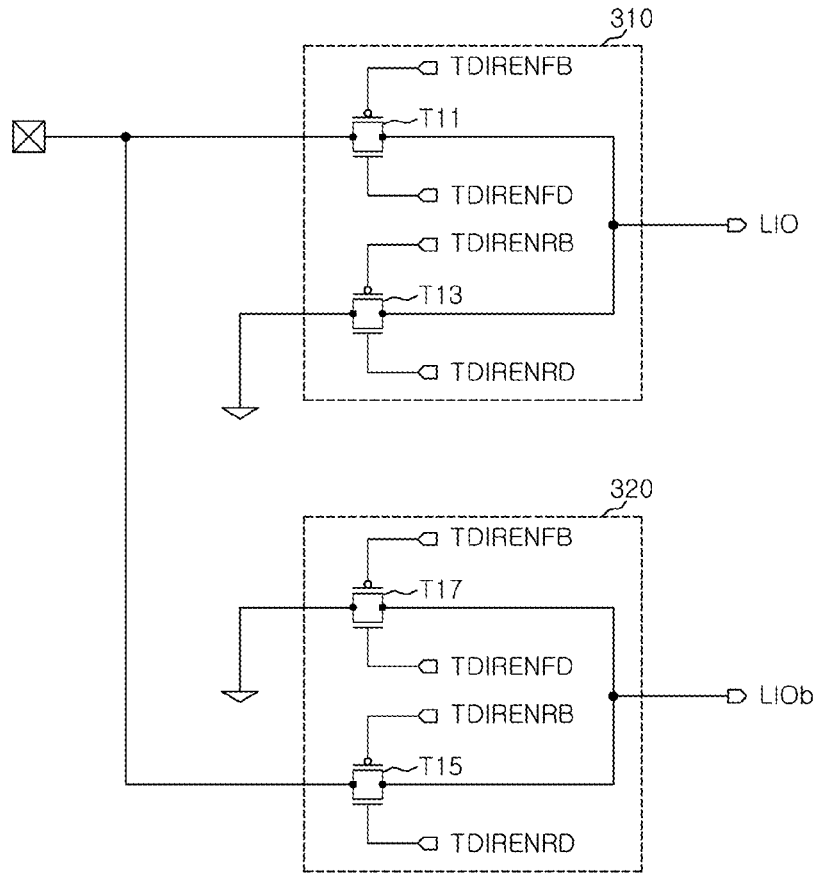
FIG. 4 is an exemplified diagram of a path establishing unit shown in FIG. 3.
Figure 5:
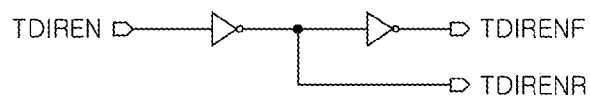
FIG. 5 is an exemplified diagram of a test mode signal generation circuit according to an embodiment of the present invention.
Figure 5:
Figure 5:

FIG. 4 is an exemplified diagram of the path establishing unit shown in FIG. 3 and FIG. 5 is an exemplified diagram of the test mode signal generation circuit according to an embodiment of the present invention.

The path establishing unit 301 may be configured to include a first path select unit 310 and a second path select unit 320 so as to change the transfer path of the data applied to the DQ paths according to the data level to be written in the memory cell at the test mode.

The first path select unit 310 may include a first transfer device T11 configured to be driven by forward test mode signals TDIRENFB and TDIRENFD to transfer or block the data applied to the DQ pads to the first local input and output lines LIO and a second transfer device T13 coupled between the first local input and output lines LIO and the ground terminal to be driven by reverse test mode signals TDIRENRB and TDIRENRD.

The second path select unit 320 may include a third transfer device T15 configured to be driven by the reverse test mode signals TDIRENRB and TDIRENRD to transfer or block the data applied to the DQ pads to the second input and output lines LIOb and a fourth transfer device T17 that is coupled between the second local input and output lines LIOb and the ground terminal to be driven by the forward test mode signals TDIRENFB and TDIRENFD.

The forward test mode signals TDIRENFB and TDIRENFD and the reverse test mode signals TDIRENRB and TDIRENRD may be generated by the test mode signal TDIREN, for example, may be generated as shown in FIG. 5.

That is, the first forward test mode signal TDIRENF is generated by delaying the test mode signal TDIREN and the first reverse test mode signal TDIRENR is generated by inverting the test mode signal TDIREN.

Further, a third forward test mode signal TDIRENFD may be generated by inverting the first forward test mode signal TDIRENF and again inverting the second forward test mode signal TDIRENFB.

Similarly, a third reverse test mode signal TDIRENRD may be generated by inverting the first reverse test mode signal TDIRENR and again inverting the second reverse test mode signal TDIRENRB.

The example of generating the forward and reverse test mode signals from the test mode signal is not limited to the circuit of FIG. 5 and therefore, the circuit may vary in a design.

As the path establishing unit 301 is configured as shown in FIGS. 4 and 5, when the test mode signal TDIREN is applied as the high level, the first transfer device T11 and the fourth transfer device T17 are turned-on, while the second transfer device T13 and the third transfer device T15 are turned-off. Therefore, the test data applied to the DQ pads are transferred to the first local input and output lines LIO through the first transfer device T11 and the data are moved in the source line direction from the bit line of the memory cell when a write operation is performed.

When the test mode signal TDIREN is applied as the low level, the second and third transfer devices T13 and T15 are turned-on to transfer the data applied to the DQ pads to the second local input and output line LIOb. As a result, the data may be moved in the bit line direction from the source line of the memory cell when a write operation is performed.

As described above, in an embodiment of the present invention, a current flows from the DQ pad to the memory cell in response to the test mode signal. Further, the forward or reverse current path is formed according to the level of the test mode signal and thus the test data may be written in the memory cell through the two paths.

As a result, both the test data of the logic high level and the logic low level may be written in the memory cells. When the memory cell may comprise the resistive memory, the test data of the logic high level and the logic low level are written and then the resistance value of the memory cell may be actually measured. Based on the actually measured resistance value, the characteristic analysis of the memory cell array may be easily performed.

Further, the switching unit 240 (FIG. 2) for forming the current path between the data input buffer and the write driver at the normal mode and forming the current pass between the data input buffer and the bidirectional access control unit at the test mode can be configured as follows.

Figure 6:
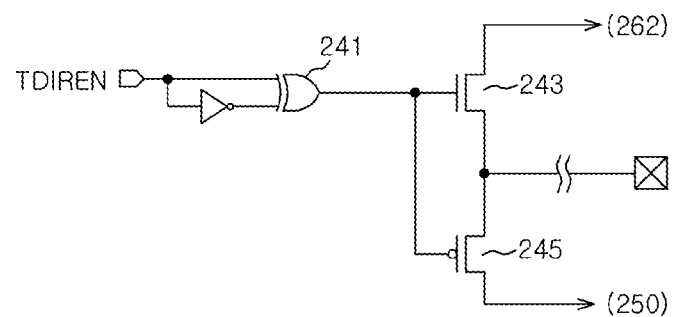
FIG. 6 is an exemplified diagram of a switching unit shown in FIG. 2.

FIG. 6 is an exemplified diagram of the switching unit shown in FIG. 2.

Referring to FIG. 6, the switching unit 240 may include a first device 241, a second device 243 and the third device 245. The first device 241 is configured to generate the output signal of the logic high level when the input signals have different phases from each other but generate the output signal of the logic low level when the phases of the input signals have the same phase, by using the test mode signal TDIREN and its inversion signal as the input signal The second device 243 is configured to provide the current applied to the DQ pads to the bidirectional access control unit 262 in response to the output signal of the first device 241, and the third device 245 is configured to provide the current applied to the DQ pads to the write driver 250 in response to the output signal of the first device 241.

In an embodiment of the present invention, the first device 241 may comprise a device XOR that performs XOR operation. In addition, the second device 243 may comprise the NMOS transistor and the third device 245 may comprise the PMOS transistor so as to be turned-on/off by the signals having a phase opposite to each other, but are not limited thereto.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus, comprising:
   a memory cell array configured to include a plurality of memory cells;
   a switching unit configured to be coupled to a data input buffer through data input and output pads and control a data transfer path of data applied to the data input buffer in response to a test mode signal;
   a write driver configured to drive data transferred from the switching unit and write the data in the memory cell array at a normal mode; and
   a controller configured to directly transfer the data from the switching unit to the memory cell without passing through the write driver at a test mode,
   wherein the memory cell array and the controller are configured to be directly coupled through a first local input and output lines which are substantially connected to bit lines of the memory cells.

2. The semiconductor memory apparatus of claim 1, wherein the controller includes a bidirectional access control unit configured to provide the data transferred from the data input buffer to the memory cell array through the first local input and output lines in response to the test mode signal.

3. The semiconductor memory apparatus of claim 2, wherein the bidirectional access control unit is configured to provide the data transferred from the data input buffer to the memory cell array through second local input and output lines in response to the test mode signal.

4. The semiconductor memory apparatus of claim 3, wherein the switching unit is coupled to global input and output lines between the data input buffer and the write driver or between the data input buffer and the controller.

5. The semiconductor memory apparatus of claim 3, wherein the bidirectional access control unit is coupled to the first and second local input and output lines between the switching unit and the memory cell array.

6. The semiconductor memory apparatus of claim 1, wherein the memory cell performs reading/writing of data by a current driving scheme.

7. The semiconductor memory apparatus of claim 1, wherein the memory cell is a resistive memory cell.

8. A semiconductor memory apparatus, comprising:
a memory cell array configured to include a plurality of memory cells coupled between bit lines and source lines and driven by potential applied to word lines; and
a bidirectional access control unit configured to directly transfer data, provided in a data input buffer through data input and output pads, from the bit line to the source line of the memory cell in response to a test mode signal or directly transfer the data, applied to the data input buffer, from the source line to the bit line of the memory cell,
wherein the memory cell array and the bidirectional access control unit are configured to be directly coupled through a first local input and output lines which are substantially connected to bit lines of the memory cells.

9. The semiconductor memory apparatus of claim 8, further comprising a write driver configured to be driven by receiving data applied to the data input buffer and write the data in the memory cell array at a normal mode.

10. The semiconductor memory apparatus of claim 9, further comprising a switching unit configured to be coupled to the data input buffer and control a transfer path of the data applied to the data input buffer so that the data are transmitted to the bidirectional access control unit or the write driver in response to the test mode signal.

11. The semiconductor memory apparatus of claim 8, wherein the memory cell performs reading/writing of data by a current driving scheme.

12. The semiconductor memory apparatus of claim 8, wherein the memory cell is a resistive memory cell.

13. A test circuit for a semiconductor memory apparatus, comprising:
a switching unit configured to control a transfer path of data applied to a data input buffer through data input and output pads; and
a bidirectional access control unit configured to receive data applied to the data input buffer and directly transfer the data to a memory cell array in response to a test mode signal,
wherein the memory cell array and the bidirectional access control unit are configured to be directly coupled through a first local input and output lines or a second local input and output lines,
and the first local input and output lines are configured to substantially connected to bit lines of the memory cells, and the second local input and output lines are configured to substantially connected to source lines of the memory cells.

14. The test circuit of claim 13, wherein the bidirectional access control unit includes a path establishing unit configured to transmit the data, applied to the data input buffer, to the first local input and output lines or to the second local input and output lines in response to the test mode signal.

15. The test circuit of claim 14, wherein the path establishing unit transfers the data applied to the data input buffer to the first local input and output lines so as to write data of a first level in the memory cell array.

16. The test circuit of claim 14, wherein the path establishing unit transfers the data applied to the data input buffer to the second local input and output lines so as to write data of a second level in the memory cell array.

17. The test circuit of claim 14, wherein the path establishing unit includes:
a first path establishing unit including a first transfer device that is driven by a forward test mode signal generated from the test mode signal and transfers or blocks the data applied to the data input buffer to the first local input and output lines; and
a second transfer device configured to be driven by a reverse test mode signal generated from the test mode signal and couple the first local input and output lines and a ground terminal.

18. The test circuit of claim 14, wherein the path establishing unit includes:
a second path establishing unit including a third transfer device that is driven by a reverse test mode signal generated from the test mode signal and transfers or blocks the data applied to the data input buffer to the second local input and output lines; and
a fourth transfer device configured to be driven by a forward test mode signal generated from the test mode signal and couple the second local input and output lines and a ground terminal.

* * * * *